US007151363B1

(12) United States Patent
Scott et al.

(10) Patent No.: US 7,151,363 B1
(45) Date of Patent: Dec. 19, 2006

(54) HIGH PSRR, FAST SETTLE TIME VOLTAGE REGULATOR

(75) Inventors: Baker Scott, Boulder, CO (US); Manbir Singh Nag, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 304 days.

(21) Appl. No.: 10/863,195

(22) Filed: Jun. 8, 2004

(51) Int. Cl.
*G05F 1/40* (2006.01)
*G05F 1/56* (2006.01)
*G05F 3/16* (2006.01)
*H03F 3/45* (2006.01)

(52) U.S. Cl. ...................... 323/282; 323/283; 323/288; 323/315

(58) Field of Classification Search ................ 323/268, 323/270, 271, 273, 281, 282, 283, 288, 313, 323/315
See application file for complete search history.

(56) References Cited

U.S. PATENT DOCUMENTS 5,227,714 A * 7/1993 Lou ........................... 323/282
5,608,353 A 3/1997 Pratt ........................... 330/295
5,629,648 A 5/1997 Pratt ........................... 330/289
5,889,395 A * 3/1999 Lundberg .................... 323/313
6,384,433 B1 5/2002 Barratt et al. ............... 257/197
6,448,750 B1 * 9/2002 Shor et al. .................. 323/282
6,560,452 B1 5/2003 Shealy ........................ 455/333
6,624,702 B1 9/2003 Dening ........................ 330/297
6,693,468 B1 2/2004 Humphreys et al. ........ 327/105
6,710,664 B1 3/2004 Humphreys et al. .......... 331/11
6,731,145 B1 5/2004 Humphreys et al. ........ 327/156
6,778,022 B1 8/2004 Zhang et al. ................. 331/14
6,782,244 B1 8/2004 Steel et al. .............. 455/127.1
6,806,786 B1 10/2004 Lam et al. .................. 331/179
6,807,406 B1 10/2004 Razavi et al. ............... 455/313
6,819,914 B1 11/2004 Yan et al. .................... 455/318
6,838,951 B1 1/2005 Nieri et al. ............. 331/177 V
6,989,708 B1 * 1/2006 Xi ............................. 327/539
2005/0243623 A1 * 11/2005 Baglin et al. ............... 365/205

* cited by examiner

*Primary Examiner*—Matthew V. Nguyen
(74) *Attorney, Agent, or Firm*—Withrow & Terranova, PLLC

(57) ABSTRACT

A voltage regulator including a high-speed feedback loop operating to provide rapid settling time and a large Power Supply Rejection Ratio (PSRR). The high-speed feedback loop includes a reservoir capacitor that stores charge based on a charging current. The charge stored by the reservoir capacitor corresponds to a regulated voltage provided by the voltage regulator. When charge is drawn from the reservoir capacitor by a load, a dip occurs in the regulated output voltage. The high-speed feedback loop operates to restore the charge to the reservoir capacitor, thereby restoring the regulated voltage to its desired value. More specifically, when charge is drawn from the reservoir capacitor, the high-speed feedback loop operates to increase the first current, thereby restoring charge to the reservoir capacitor.

52 Claims, 6 Drawing Sheets

HIGH PSRR, FAST SETTLE TIME VOLTAGE REGULATOR

FIELD OF THE INVENTION

The present invention relates to a voltage regulator and more particularly relates to a voltage regulator having a high-speed feedback loop and a charge compensation scheme for further reducing a settling time of the voltage regulator.

BACKGROUND OF THE INVENTION

A voltage regulator is a device that provides a regulated voltage that remains substantially constant as load current and supply voltage change. Typically, a voltage regulator includes a large pass transistor to pass current into the load, and the regulator is stabilized externally using a large external capacitor, such as a 0.1 μF to 1 μF capacitor, and a small on-chip metal resistance. However, the large external capacitor increases the parts count, increases the cost of the voltage regulator and dramatically reduces the regulator's bandwidth of operation.

Instead of using a large external capacitor, the voltage regulator may be stabilized by connecting a Miller capacitor from the gate of the large pass transistor to the drain of the large pass transistor. While the Miller capacitor provides a compact method of stabilizing the voltage regulator, it passes high frequencies and therefore significantly reduces the Power Supply Rejection Ratio (PSRR) of the regulator. Further, the voltage regulator stabilized by the Miller capacitor has a very low frequency response, approximately 10 KHz–100 KHz. Accordingly, in systems that operate above 100 KHz, the voltage regulator may require more than one clock cycle to settle the regulated voltage to its desired value each time the load current changes. Requiring more than one clock cycle to settle the regulated voltage introduces errors into systems where the regulator is used as a voltage reference for signal processing blocks and is therefore undesirable, especially in wireless communications environments. It should be noted that this technique also reduces the regulator's bandwidth of operation.

Thus, there remains a need for a voltage regulator that is stabilized by an on-chip capacitor and that has both a fast settling time and a high PSRR.

SUMMARY OF THE INVENTION

The present invention provides a voltage regulator including a high-speed feedback loop operating to provide rapid settling time and a large Power Supply Rejection Ratio (PSRR). The high-speed feedback loop includes a reservoir capacitor that stores charge based on a charging current. The charge stored by the reservoir capacitor corresponds to a regulated voltage provided by the voltage regulator. When charge is drawn from the reservoir capacitor by a load, a dip occurs in the regulated output voltage. The high-speed feedback loop operates to restore the charge to the reservoir capacitor, thereby restoring the regulated voltage to its desired value. More specifically, when charge is drawn from the reservoir capacitor, the high-speed feedback loop operates to rapidly increase the charging current, thereby rapidly restoring charge to the reservoir capacitor.

The high-speed feedback loop includes a current mirror having a current mirror gain ratio. The current mirror operates based on a reference current that is inversely related to the regulated output voltage. Accordingly, when there is a dip in the regulated output voltage, the reference current increases. Based on the reference current and the current mirror gain ratio, the current mirror operates to increase the charging current and thereby restore the regulated output voltage to its desired value. In one embodiment, the current mirror gain ratio is greater than one such that an increase in the reference current results in a larger increase in the charging current, thereby providing rapid charging of the reservoir capacitor.

In one embodiment, the voltage regulator is employed in a system implementing a charge compensation scheme that further reduces the settling time of the voltage regulator caused by charge injection from a digital bit stream representation of a signal. In general, the system includes the voltage regulator, a digital signal interface, and a reconstruction filter. The digital signal interface receives a data bit stream representation of a data signal and operates to re-time the data signal to provide a low jitter digital signal. This low jitter digital signal is used to cause the voltage regulator to be sampled by the reconstruction filter in either an inverting or noninverting manner based the value of the digital signal. The reconstruction filter operates as an interface between the digital and the analog domains. More particularly, the reconstruction filter samples the regulator during a sampling period and thereafter processes and filters the sampled regulator charge based on the digital signal to provide an analog output signal.

To implement the charge compensation scheme, the system also includes sampling charge compensation circuitry and data acquisition charge compensation circuitry. The sampling charge compensation circuitry operates restore charge to a reservoir capacitor in the voltage regulator as charge is being taken from the reservoir capacitor by the reconstruction filter during the sampling phase. The data acquisition charge compensation circuitry operates to restore charge to the reservoir capacitor as charge is being taken from the reservoir capacitor by the data interface when the digital signal transitions between a first logic state and a second logic state. Thus, the charge compensation scheme provides charge compensation to the reservoir capacitor during the sampling phase of the reconstruction filter and at the moment the digital signal transitions between the first logic state and the second logic state.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
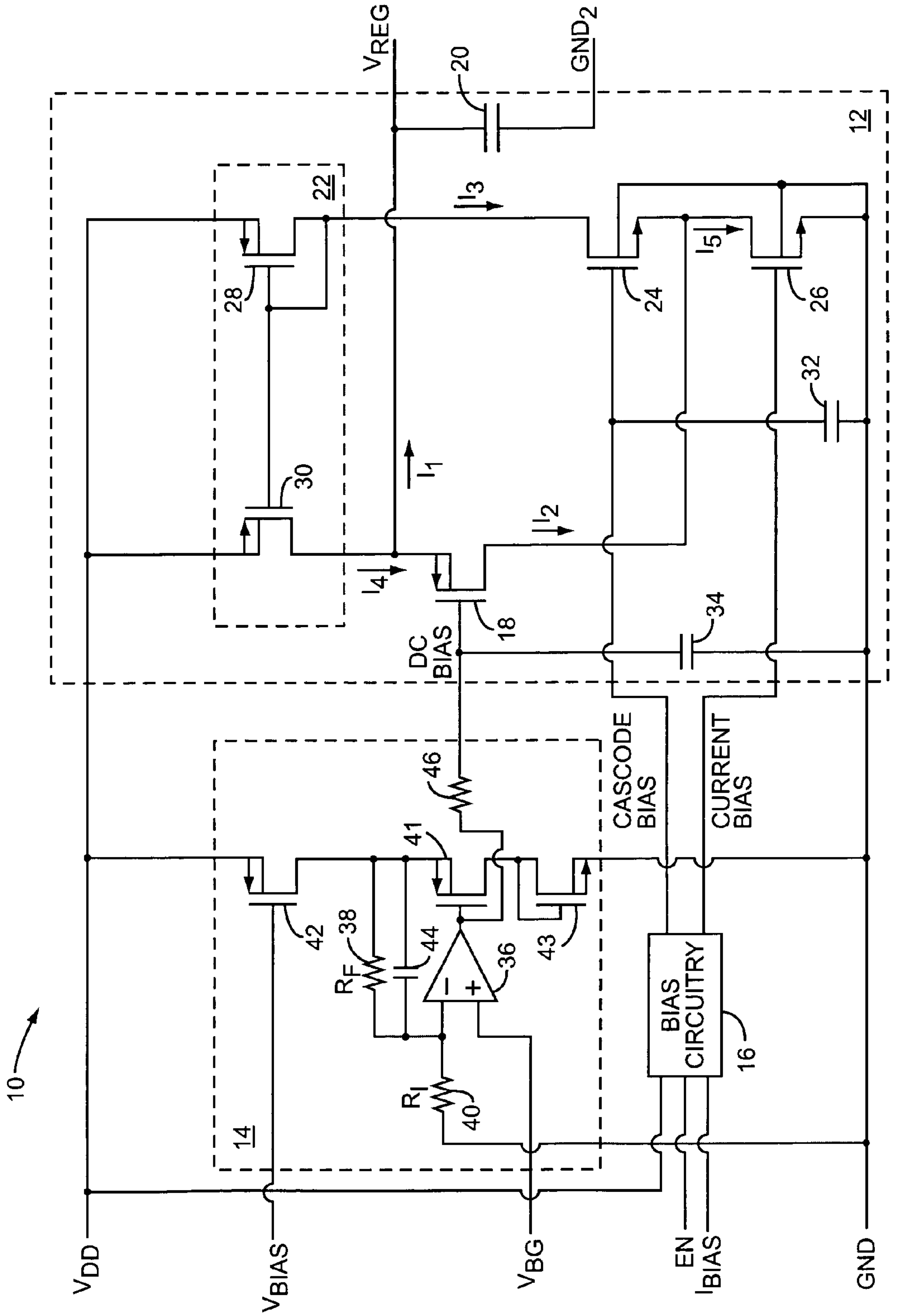
FIG. 1 illustrates a voltage regulator having a high-speed feedback loop according to one embodiment of the present invention.

FIG. 1 illustrates a voltage regulator 10 having a large power supply rejection ratio (PSRR) and a fast settling time according to one embodiment of the present invention. The voltage regulator 10 includes high-speed feedback loop 12 voltage bias circuitry 14, and current bias circuitry 16. The high-speed feedback loop 12 includes an output transistor 18, which is configured in a folded cascode arrangement, and a reservoir capacitor 20 coupled to the output of the output transistor 18. The output transistor 18 provides a regulated voltage ($V_{REG}$) across the reservoir capacitor 20. The reservoir capacitor 20 creates a dominant compensation pole of the voltage regulator 10. As discussed below in detail, charge is stored in the reservoir capacitor 20 by a current I1 such that the regulated voltage ($V_{REG}$) remains substantially constant as the load is varied. The high-speed feedback loop 12 also includes a current mirror 22, cascode transistor 24, and a current source 26. The illustrated embodiment of the current mirror 22 includes transistors 28 and 30 arranged as shown. As illustrated, the current sources 26 and the cascade transistor 24 are each NMOS transistors. However, the current source 26 and the cascode transistor 24 may be implemented in numerous ways as will be apparent to one of ordinary skill in the art.

When no charge is drawn from the reservoir capacitor 20 by an external circuit connected to the regulated voltage ($V_{REG}$), the output transistor 18 draws a current I2 based on a DC bias and the charge stored across the reservoir capacitor 20, which corresponds to the regulated voltage ($V_{REG}$). The transistor 28 in the current mirror 22 sinks a current I3, and the transistor 30 in the current mirror 22 provides a current I4, where the current I4 is defined as the current I3 multiplied by a current mirror gain ratio (M). The current mirror gain ratio (M) may be any number greater than zero. However, in one embodiment, the current mirror gain ratio (M) is greater than one. When no charge is drawn from the reservoir capacitor 20, the current I4 is essentially equal to the current I2 such that the current I1 is essentially zero and the charge on the reservoir capacitor 20 remains constant.

When charge is drawn from the reservoir capacitor 20, there is a dip in the regulated voltage ($V_{REG}$). The instantaneous effect of this voltage dip is to reduce a voltage from the gate to the source of the output transistor 18, thereby reducing the current I2. The current sources 26 is biased to produce a current I5, where the current I5 is a constant current. Thus, the reduction in the current I2 causes an instantaneous increase in the current I3 such that the sum of the currents I2 and I3 is essentially equal to the constant current I5. In response to the increase in the current I3, the current mirror 22 operates to increase the current I4. The increase in the current I4 is essentially equal to the increase in the current I3 multiplied by the current mirror gain ratio (M). By increasing the current I4, the current I4 becomes larger than the current I2. Accordingly, the current I1 increases and is essentially equal to I4–I2. The current I1 builds charge in the reservoir capacitor 20. As the charge in the reservoir capacitor 20 increases, the current I2 increases, thereby causing a decrease in the currents I3, I4, and I1.

Once the current I2 has increased to a point where the current I2 is essentially equal to the current I4, the reservoir capacitor 20 is charged to a point where the regulated voltage ($V_{REG}$) is restored to its desired value. It should be noted that the desired value of the regulated voltage ($V_{REG}$) is constant such that the regulated voltage ($V_{REG}$) is always restored to the same voltage. The time between the initial discharging of the reservoir capacitor 20 and the restoration of the regulated voltage ($V_{REG}$) to its desired value is called the "settling time" of the voltage regulator 10. It should be noted that the settling time and bandwidth of the voltage regulator 10 depends on the current mirror gain ratio (M), the capacitance of the reservoir capacitor 20, and the transconductance (gm) of the output transistor 18. Accordingly, the capacitance of the reservoir capacitor 20 the current mirror gain ratio (M) and the gm of output transistor 18 are selected to provide the desired bandwidth and settling time. In one embodiment, the reservoir capacitor 20 is a 10 pF capacitor and the voltage regulator 10 settles to within 1 mV of the desired regulated voltage ($V_{REG}$) within 3 ns.

As an example, if the current source 26 is biased such that I5 is 500 μA and the current mirror gain ratio (M) is 1.5, then the currents I2 and I4 are essentially equal to 300 μA and the current I3 is essentially equal to 200 μA when no charge is being drawn from the reservoir capacitor 20. Each time charge is drawn from the reservoir capacitor 20 by a load (not shown) connected to the regulated voltage ($V_{REG}$), a dip in the regulated voltage ($V_{REG}$) occurs. The dip in the regulated voltage ($V_{REG}$) causes an instantaneous reduction in the current I2 proportional to the transconductance (gm) of the output transistor 18. For example, the current I2 may be reduced to 200 μA. In order to provide the 500 μA current I5, the current I3 increases to 300 μA. As a result of the increase in the current I3 and the current mirror gain ratio of 1.5, the current I4 increases to 450 μA. Since the current I2 and I4 are no longer equal, the current I1 is no longer zero and is 250 μA (450 μA–200 μA). The current I1 builds charge in the reservoir capacitor 20, thereby increasing the regulated voltage ($V_{REG}$). As the charge in the reservoir capacitor 20 increases, the current I2 also increases, thereby decreasing I3, I4, and I1. Once the current I2 has increased back to 300 μA, the current I4 is also 300 μA, and the regulated voltage ($V_{REG}$) is restored to its desired value.

The high-speed feedback loop 12 also includes a bypass capacitor 32 and compensation capacitor 34. The bypass capacitor 32 bypasses the gate of cascode transistor 24. The pole created by the bypass capacitor 32 is not part of the high-speed loop 12. Rather, the bypass capacitor 32 improves high frequency PSRR of the voltage regulator 10. The compensation capacitor 34 compensates the voltage bias circuitry 14 and helps isolate the high speed loop 12 from the slower voltage bias circuitry 14.

The voltage regulator 10 also includes the voltage bias circuitry 14. The voltage bias circuitry 14 operates to generate the DC bias from a stable bandgap voltage ($V_{BG}$) and to provide DC bias for the output transistor 18. The illustrated embodiment of the voltage bias circuitry 14 includes an operational amplifier 36, a feedback resistor 38, an input resistor 40, an output matching transistor 41, a current source transistor 42, and a diode connected transistor 43. Operational amplifier 36 is in a non-inverting mode and provides a closed loop gain equal to $1+R_F/R_{IN}$. Thus, the values $R_F$ and $R_{IN}$ can be selected such that the bandgap voltage ($V_{BG}$) is amplified to provide the desired regulator output voltage ($V_{REG}$). For example, if the desired regulator output voltage ($V_{REG}$) is 2.5 V and the bandgap voltage is 1.215 V, the values $R_F$ and $R_{IN}$ can be selected to provide a gain of 1.0575. The matching output transistor 41 is a smaller version of the output transistor 18 and is biased by the current source 42 to have the same current density and thus the same gate to source voltage ($V_{GS}$) as output transistor 18. The matching of the transistor 41 to the output transistor 18 produces a DC bias output such that the $V_{GS}$ of the output transistor 18 will add to the DC bias voltage to replicate the desired regulator output voltage ($V_{REG}$). The feedback resistor 38 is bypassed by a capacitor 44. The value of the capacitor 44 is selected to create a zero at a frequency that offsets a pole created by the feedback resistor 38 and the input capacitance of the operational amplifier 36. As discussed above, the high-speed feedback loop 12 includes the compensation capacitor 34 that compensates the operational amplifier 36. Further, the voltage bias circuitry 14 includes a resistor 46 in series with the output of the operational amplifier 36, wherein the resistor 46 is a zero nulling resistor. It should also be noted that the output transistor 18 of the high-speed feedback loop 12 is not in the feedback loop of the operational amplifier 36. Instead, the matching transistor 41 in conjunction with the operational amplifier 36 generates the DC bias voltage for the output transistor 18. Accordingly, the bandwidth of the high-speed feedback loop 12 can be set by the designer and is not limited to the unity gain bandwidth of the operational amplifier 36.

The voltage regulator 10 also includes the current bias circuitry 16. The current bias circuitry 16 operates to provide the bias voltages to the current source 26 and the cascode transistor 24 based on a bias input signal ($I_{BIAS}$). In addition, the current bias circuitry 16 may also operate based on the enable signal (EN) to either activate or deactivate the high-speed feedback loop 12 based on the enable signal (EN). In general, the current bias circuitry 16 operates to bias the current source 26 and the cascade transistor 24 such that they remain in saturation. There are numerous ways to implement the current bias circuitry 16 which will be appreciated by one of ordinary skill in the art, and the exact details of the current bias circuitry 16 will depend upon the particular implementation.

Figure 2:
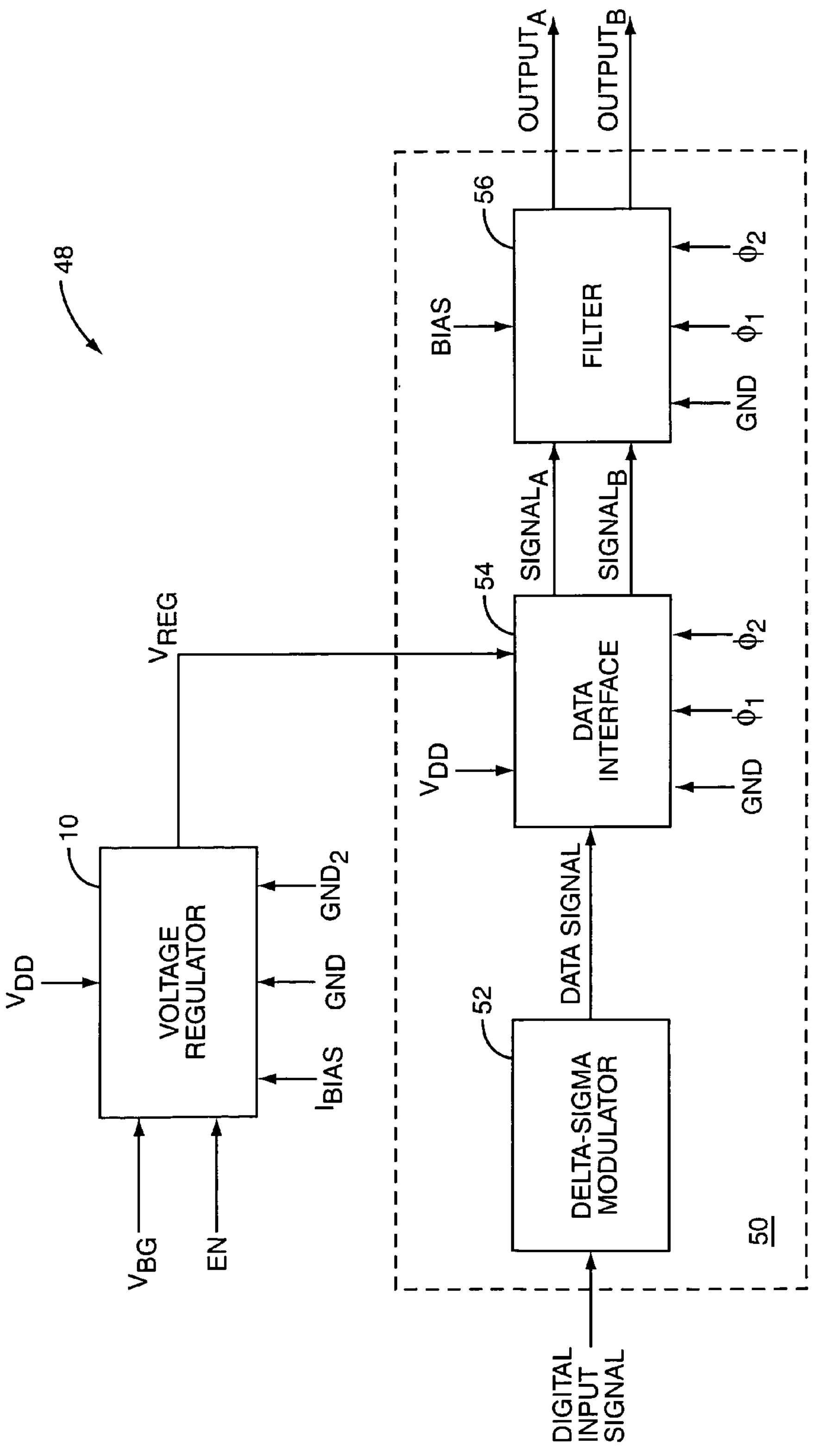
FIG. 2 illustrates a system implementing the voltage regulator of FIG. 1 according to one embodiment of the present invention.

FIG. 2 illustrates a system 48 wherein the voltage regulator 10 of FIG. 1 is implemented to provide the regulated voltage to a delta-sigma digital-to-analog (D/A) converter 50. The delta-sigma D/A converter 50 includes a delta-sigma modulator 52, a data interface 54, and a reconstruction filter 56. The delta-sigma modulator 52 provides the data signal (DATA) based on a digital input signal (DIGITAL INPUT SIGNAL). The delta-sigma modulator 52 may be part of a digital controller (not shown) or any other digital circuitry depending on the particular implementation. As illustrated, the regulated voltage ($V_{REG}$) from the voltage regulator 10 is provided to the data interface 54. The data interface 54 receives non-overlapping clock signals ϕ1 and ϕ2 and operates to re-time the data signal (DATA) from the delta-sigma modulator 52 as well as to switch $SIGNAL_A$ and $SIGNAL_B$ differentially between the regulator voltage from 10 and the regulator ground. The switching of $SIGNAL_A$ and $SIGNAL_B$ is determined by the value of the incoming data signal (DATA) with the effect of either providing plus or minus the regulator voltage ($V_{REG}$) differentially through $SIGNAL_A$ and $SIGNAL_B$ to the reconstruction filter 56. The reconstruction filter 56 receives the differential signal ($SIGNAL_A$ and $SIGNAL_B$) from the data interface 54 and operates to filter the differential signal ($SIGNAL_A$ and $SIGNAL_B$) to provide a differential analog output signal ($OUTPUT_A$, $OUTPUT_B$). The reconstruction filter 56 may be a switched capacitor filter, a continuous-time filter, or a RC-based filter.

Thus, the reconstruction filter 56 acts as an interface between the digital and analog domains. In one embodiment, the reconstruction filter 56 is a partially a discrete-time switched-capacitor reconstruction filter, which is much more immune to clock jitter than a continuous time reconstruction filter. However, any reconstruction filter 56 is very sensitive to data dependent voltage regulator amplitude variation, often referred to as data dependent regulator amplitude modulation (AM). For example, in one embodiment, a data dependent voltage regulator AM in the region of 1 mVpp can create a degraded noise floor of about 90–95 dBc at the reconstruction filter output. Accordingly, in this embodiment, the reconstruction filter 56 is sensitive to variations in the amplitude, or magnitude, of the regulated voltage ($V_{REG}$) at the time it is sampled.

In operation, the reconstruction filter 56 receives the non-overlapping clock signals ϕ1 and ϕ2, and operates to sample the voltage regulated differential signal ($signal_A$ and $signal_b$) during ϕ1 and to process the sampled signal during ϕ2. Each time the reconstruction filter 56 samples the differential signal ($signal_A$ and $signal_B$) during ϕ1, switches are closed in the reconstruction filter 56 and charge is drawn from the data interface 54, which results in discharging of the reservoir capacitor 20 (FIG. 1). As discussed above, discharging of the reservoir capacitor 20 causes a dip in the regulated voltage ($V_{REG}$). The voltage regulator 10 operates to restore the regulated voltage ($V_{REG}$) to its desired value. Further, the settling time of the voltage regulator 10 is such that the regulated voltage ($V_{REG}$) is restored to its desired value prior to the end of ϕ1. In one embodiment, the settling time of the voltage regulator 10 is such that the regulated voltage ($V_{REG}$) is restored to its desired value within the first half of ϕ1. By restoring the regulated voltage ($V_{REG}$) to its desired value prior to the end of ϕ1, any variations in the differential signal ($signal_A$ and $signal_B$) that would have been caused by variations in the regulated voltage ($V_{REG}$) during ϕ1 are avoided. In doing so, noise in differential output signal ($OUTPUT_A$ and $OUTPUT_B$) resulting from variations in the regulated voltage ($V_{REG}$) during ϕ1 is also avoided.

However, when considering silicon process variations, the settling time of the voltage regulator 10 may be prolonged. In some situations, the settling time may be prolonged such that it approaches the end of the half clock cycle of ϕ1. Thus, according to another embodiment of the present invention, the data interface 54 further provides a charge compensation scheme that assists the voltage regulator 10 in restoring charge to the reservoir capacitor 20, thereby further reducing the settling time of the voltage regulator 10.

Before discussing the charge compensation scheme, it may be beneficial to discuss two sources of voltage regulator AM. First, in the delta-sigma D/A converter 50, the data signal (DATA) switches only between logic 0 and logic 1. However, the data signal (DATA) does not always change each clock cycle. The Delta Sigma Modulator 52 changes the data signal (DATA) in a random or noise like manner with the low frequency average of the states proportional to the digital input signal (DIGITAL INPUT SIGNAL). When the data signal (DATA) changes states, a large amount of charge is either drawn or sunk from the reservoir capacitor 20 (FIG. 1) by the data interface 54, thereby causing a corresponding voltage drop in the regulated voltage ($V_{REG}$). It should be noted that the data signal (DATA) may change states during any ϕ2 time. Thus, in order to further reduce the settling time of the voltage regulator 10, the charge compensation scheme of the present invention provides data dependent charge compensation at the moment the data changes, as discussed below in detail.

A second possible source of voltage regulator AM is the sampling operation of the reconstruction filter 56 during ϕ1 of the clock. The switched-capacitor reconstruction filter 56 samples differential signal ($signal_A$, $signal_B$) during ϕ1 of the clock. It is at the end of this part of the clock that noise and voltage reference AM on the signal must be kept to a minimum. During ϕ1 of the clock, charge is transferred from the data interface 54 to a sampling network (not shown) of the reconstruction filter 56. This charge will be drawn or sunk from the reservoir capacitor 20 (FIG. 1), which will create a corresponding sag or other perturbation in the regulated voltage ($V_{REG}$). The present invention operates to minimize this glitch so that the regulated voltage ($V_{REG}$) rapidly returns to either its designed voltage. The voltage regulator 10 operates to restore the charge. However, if this charge is not restored rapidly, the differential signal ($signal_A$, $signal_B$) will still be changing when the sampling time ends. As a result, variations in the regulated voltage ($V_{REG}$) will be seen by the reconstruction filter 56 and the AM modulation of the noise shaped data signal from the delta-sigma modulator 52 will fold out of band noise and spurs into the pass band of the reconstruction filter 56 thus degrading performance. In one embodiment, it is desirable for the regulated voltage ($V_{REG}$) to settle within half of the ϕ1 operating clock period to avoid this error.

Accordingly, the data interface 54 employs a charge compensation scheme of the present invention for restoring charge to the reservoir capacitor 20 (FIG. 1) during data acquisition and during ϕ1, which is the sampling period of the reconstruction filter 56.

Figure 3:
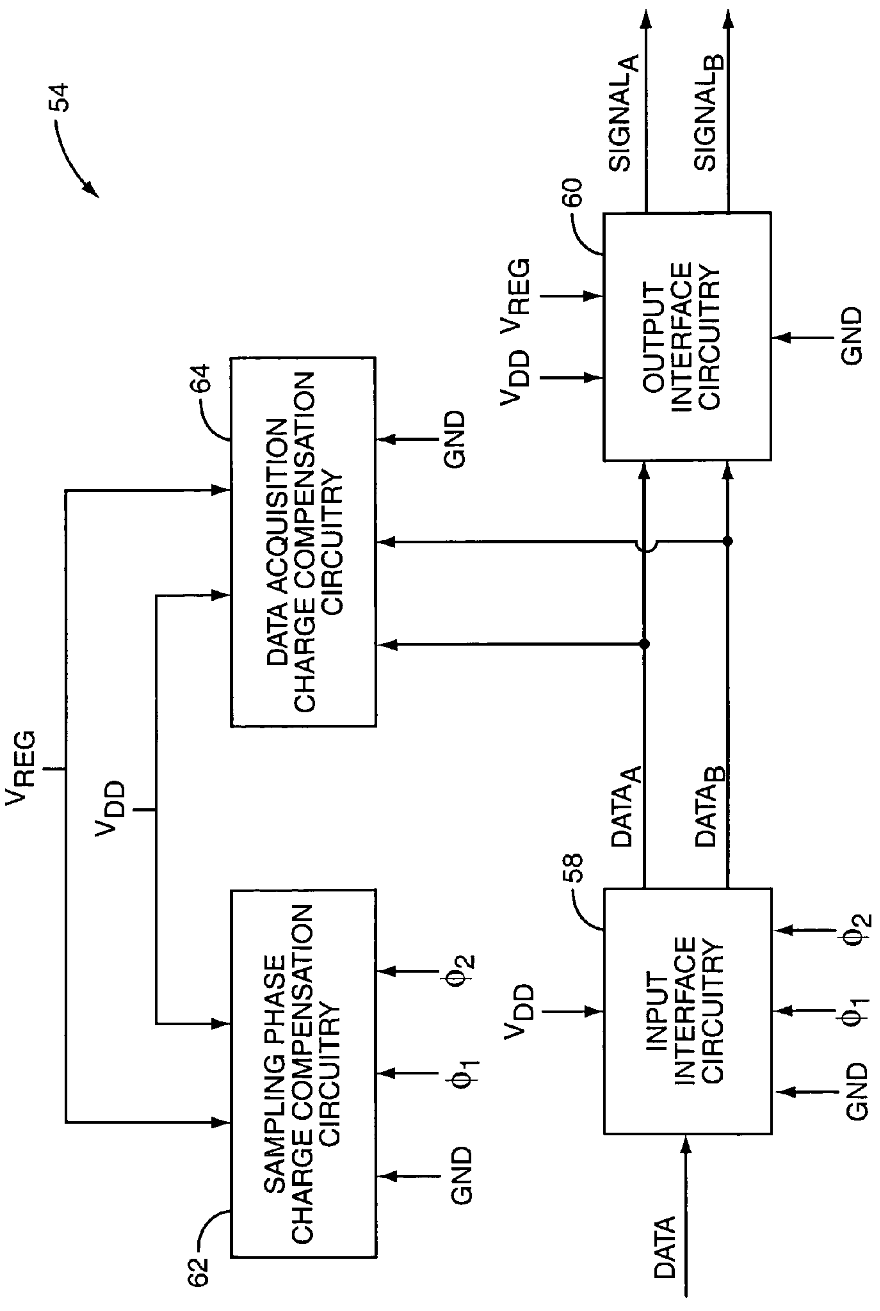
FIG. 3 is a more detailed illustration of the data interface of FIG. 2 according to one embodiment of the present invention.

FIG. 3 is a detailed block diagram of one embodiment of the data interface 54. As illustrated, the data interface 54 includes input interface circuitry 58, output interface circuitry 60, sampling charge compensation circuitry 62, and data charge compensation circuitry 64. In general, the input interface circuitry 58 receives the data signal (DATA), re-times the data input signal (DATA), and provides the differential data signal ($DATA_A$, $DATA_B$). The output interface circuitry 60 includes data buffers and switches to generate differential signal ($signal_A$, $signal_B$) for interfacing the data interface 54 to the reconstruction filter 56.

The sampling phase charge compensation circuitry 62 operates to provide charge compensation during the sampling phase of the reconstruction filter 56, which is when the clock signal ϕ1 is asserted. More specifically, the sampling phase charge compensation circuitry 62 operates to assist the voltage regulator 10 (FIG. 1) in restoring charge to the reservoir capacitor 20 (FIG. 1) as charge is drawn from the reservoir capacitor 20 by the sampling circuitry in the reconstruction filter 56. It should also be noted, that in this embodiment, the sampling phase charge compensation circuitry 62 provides replenishing charge to the reservoir capacitor 20 by charging a compensation capacitor from the supply voltage ($V_{DD}$) when the clock signal ϕ1 is not asserted and then discharging the compensation capacitor during the subsequent ϕ1 onto the voltage regulator output to help compensate for charge sampled by the reconstruction filter 56. In one embodiment, the supply voltage ($V_{DD}$) is from a regulator other than the voltage regulator 10 and is not sampled by the reconstruction filter 56. Thus, the regulated voltage ($V_{REG}$) that is sampled by the reconstruction filter 56 is not corrupted by voltage drops in the supply voltage ($V_{DD}$) associated with the operation of the sampling phase charge compensation circuitry 62.

The data acquisition charge compensation circuitry 64 operates to provide replenishing charge to the reservoir capacitor 20 (FIG. 1) when the differential data signal ($DATA_A$, $DATA_B$) changes states. As discussed above, when the differential data signal ($DATA_A$, $DATA_B$) changes states, charge is drawn from the regulated voltage ($V_{REG}$) and thus the reservoir capacitor 20. Thus, during data acquisition in ϕ2, the data acquisition charge compensation circuitry 64 operates to assist the voltage regulator 10 in restoring charge to the reservoir capacitor 20 and thereby return the regulated voltage ($V_{REG}$) to its desired value during ϕ2.

Similarly to the sampling phase charge compensation circuitry 62, the data acquisition charge compensation circuitry 64 provides replenishing charge to the reservoir capacitor 20 from the supply voltage ($V_{DD}$). In one embodiment, the supply voltage ($V_{DD}$) is from a regulator other than the voltage regulator 10 and that is not sampled by the reconstruction filter 56. Thus, the regulated voltage ($V_{REG}$) that is sampled by the reconstruction filter 56 is not corrupted by voltage drops in the supply voltage ($V_{DD}$) associated with the operation of the data acquisition charge compensation circuitry 64.

Figure 4:
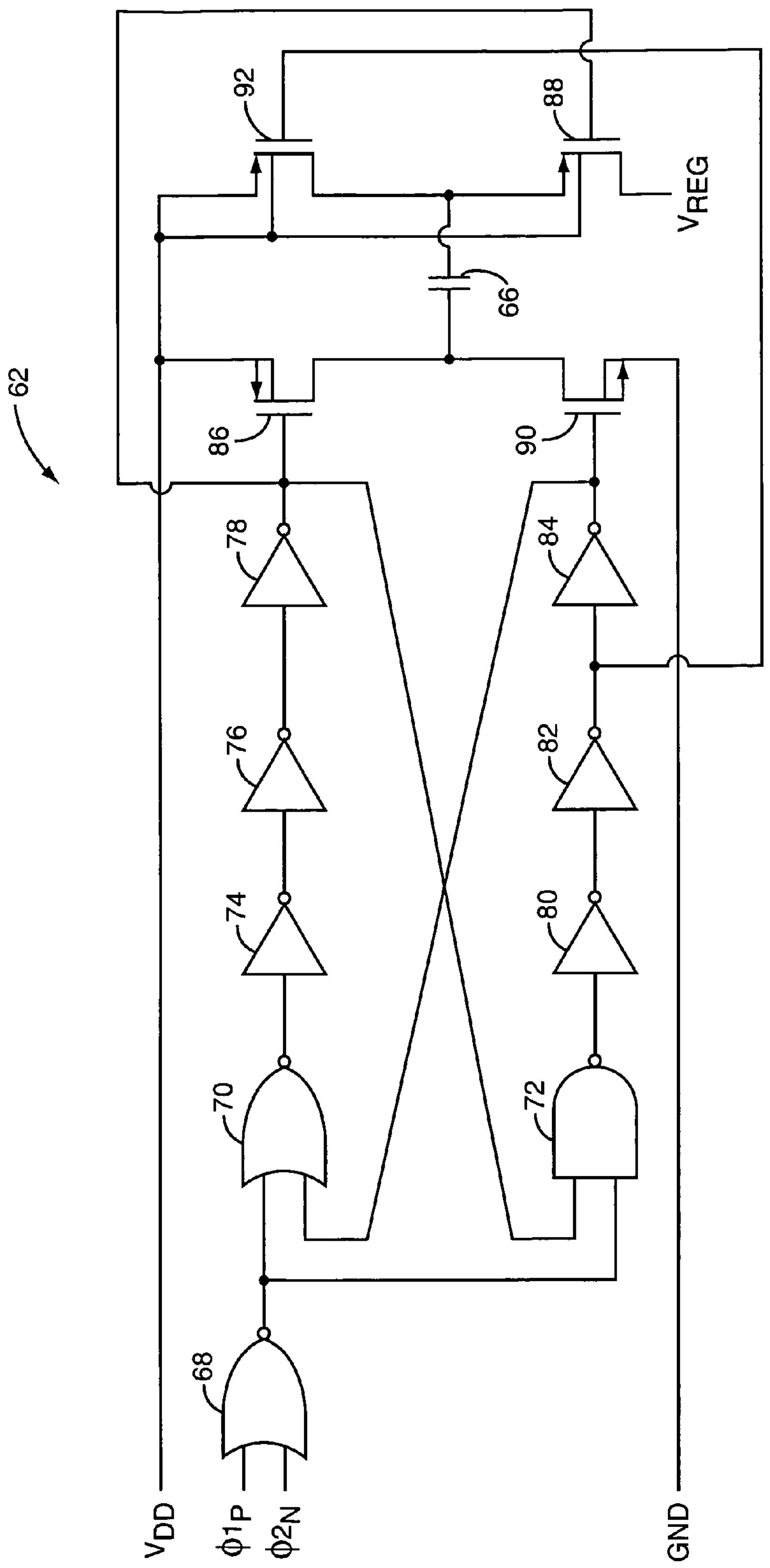
FIG. 4 is a detailed schematic of the sampling phase charge compensation circuitry of FIG. 3 according to one embodiment of the present invention.

FIG. 4 is a detailed schematic of one embodiment of the sampling phase charge compensation circuitry 62. In general, the sampling phase charge compensation circuitry 62 includes a non-overlapping gate drive inverter, a charge compensation capacitor 66, and charge redistribution switches 88 and 92. The non-overlapping gate drive inverter includes logic gates 68–84 and transistors 86,90. It should be noted that, in this embodiment, the non-overlapping clock signal ϕ1 and ϕ2 are each differential signals.

In operation, the NOR gate 68 receives the positive component ($\phi 1_P$) of the clock signal ϕ1 and the negative component ($\phi 2_N$) of the clock signal ϕ2. When either $\phi 1_P$ or $\phi 2_N$ is logic 1, or "high," the logic gates 68–84 operate to turn on the transistors 86 and 88 and turn off the transistor 90 and 92 such that replenishing charge is supplied from the compensation capacitor 66 to the regulated voltage ($V_{REG}$) and thus the reservoir capacitor 20 (FIG. 1). When both $\phi 1_P$ and $\phi 2_N$ are logic 0, or "low," the logic gates 68–84 operate to turn transistors 90 and 92 on and transistor 86 and 88 off such that charge is supplied to the compensation capacitor 66 from the supply voltage ($V_{DD}$). Accordingly, the sampling phase charge compensation circuitry 62 couples the compensation capacitor 66 to the regulated voltage ($V_{REG}$) and thus the reservoir capacitor 20 (FIG. 1) during the sampling phase of the reconstruction filter 56. When the reconstruction filter 56 is not in the sampling phase ϕ1, the sampling phase charge compensation circuitry 62 couples the compensation capacitor 66 to the supply voltage ($V_{DD}$) such that charge is restored to the compensation capacitor 66.

The transistors 86 and 88 and the compensation capacitor 66 are sized such that they duplicate an RC time constant of the sampling circuit of the reconstruction filter 56. Further, the transistors 86, 88, and 92 are made of essentially the same material as sampling switches in the sampling circuitry of the reconstruction filter 56 and are sized such that their gate-source capacitance ($C_{gs}$) is identical to the corresponding device in the sampling circuit. Additionally, the compensation capacitor 66 is sized such that it can replenish essentially the same amount of charge to the reservoir capacitor 20 of the voltage regulator 10 as that taken from the reservoir capacitor 20 by the sampling circuit during the sample phase ϕ1. It should also be noted that in this embodiment the bulk terminals of the transistors 86, 88, and 92 are tied to the supply voltage ($V_{DD}$) such that glitches caused by the charging and discharging of bulk-drain, bulk-gate and bulk-source capacitance are seen on the supply voltage ($V_{DD}$) rather than the regulated voltage ($V_{REG}$).

It should be noted that the non-overlapped gate drive is essentially a "break-before-make" switch which shuts off the transistors 86 and 88 before turning on the transistor 90 and 92, thereby practically removing all shoot though currents. The amount of delay between shutting off the transistors 86 and 88 and turning on the transistor 90 and 92 is determined by the number of inverters 74–78 and 80–84. It should also be noted that traditional inverters could alternatively be used instead of non-overlapping switches 86 and 90. However, traditional inverters will create high shoot-through currents each time the output of the NOR gate 68 switches logic states.

Figure 5:
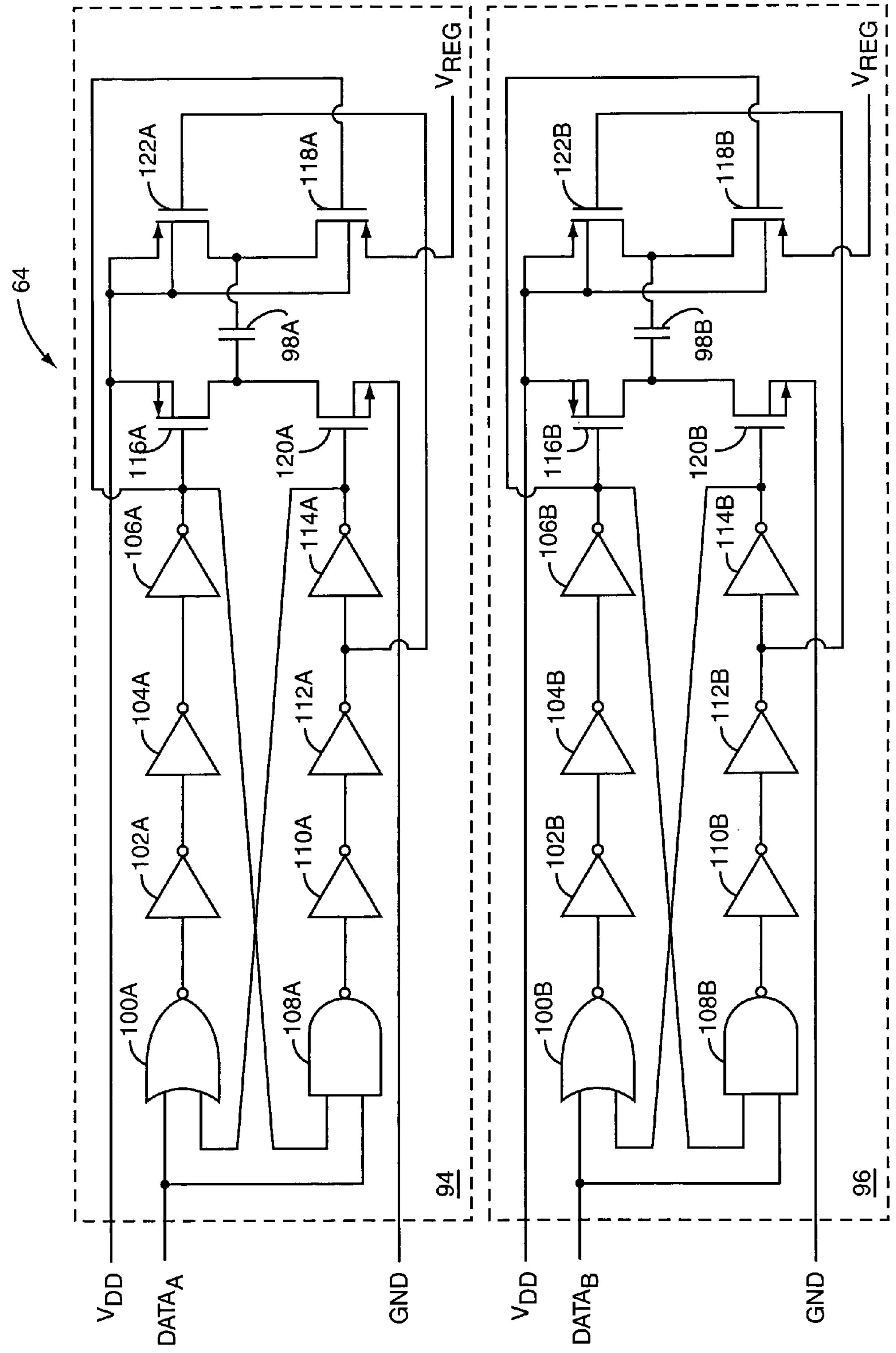
FIG. 5 is a detailed schematic of the data acquisition charge compensation circuitry of FIG. 3 according to one embodiment of the present invention.

FIG. 5 is a detailed schematic of one embodiment of the data acquisition charge compensation circuitry 64. The data acquisition charge compensation circuitry 64 is similar to the sampling phase charge compensation circuitry 62 described above. However, the data acquisition charge compensation circuitry 64 operates based on the differential data signal ($DATA_A$, $DATA_B$) rather than the clock signals ϕ1 and ϕ2. Further, the data acquisition charge compensation circuitry 64 includes first circuitry 94 for supplying charge compensation based on the positive component ($DATA_A$) of the differential data signal ($DATA_A$, $DATA_B$), and second circuitry 96 for supplying charge compensation based on the negative component ($DATA_B$) of the differential data signal ($DATA_A$, $DATA_B$). Each of the first and second circuitries 94 and 96 include a non-overlapping gate drive inverter and a charge compensation capacitor 98.

In the first circuitry 94, the non-overlapping gate drive inverter includes logic gates 100A–114A and transistors 116A and 120A. In operation, when the positive component ($DATA_A$) transitions from logic 1 to logic 0, or from "high" to "low," the logic gates 100A–114A operate to turn the transistors 116A and 118A on and the transistor 120A and 122A off such that replenishing charge is supplied from the compensation capacitor 98A to the regulated voltage ($V_{REG}$) and thus the reservoir capacitor 20 (FIG. 1). When the positive component ($DATA_A$) transitions from back to logic 1 from logic 0, the logic gates 100A–114A operate to turn the transistors 120A and 122A on and the transistor 116A and 118A off such that charge compensation stops and charge is supplied to the compensation capacitor 98A from the supply voltage ($V_{DD}$).

Similarly, in the second circuitry 96, the non-overlapping gate drive inverter includes logic gates 100B–114B and transistors 116B and 120B. In operation, when the negative component ($DATA_B$) transitions from logic 1 to logic 0, or from "high" to "low," the logic gates 100B–114B operate to turn the transistors 116B and 118B on and the transistor 120B and 122B off such that replenishing charge is supplied from the compensation capacitor 98B to the regulated voltage ($V_{REG}$) and thus the reservoir capacitor 20 (FIG. 1). When the negative component ($DATA_B$) transitions from back to logic 1 from logic 0, the logic gates 10B–114B operate to turn the transistors 120B and 122B on and the transistor 116B and 118B off such that charge compensation stops and charge is supplied to the compensation capacitor 98B from the supply voltage ($V_{DD}$).

Thus, the combined effect of the first circuitry 94 and the second circuitry 96 is to provide charge compensation at the moment the differential signal ($DATA_A$, $DATA_B$) transitions between the logic states. More specifically, by providing circuits 94 and 96 the data-based charge compensation occurs on both the rising and falling edges of the input data.

In both the first circuitry 94 and the second circuitry 96, the transistors 116, 118 and the compensation capacitor 98 are sized such that a resultant RC time constant matches an RC time constant of the charge drawn from the reservoir capacitor 20 of the voltage regulator 10 (FIG. 1) during data transitions. Further, the charge compensation capacitor 98 is sized to match a total gate capacitance of the data interface 54. Also, in this embodiment, the bulk terminals of the transistor 116, 118, and 122 are tied to the supply voltage ($V_{DD}$) rather than to the regulated voltage ($V_{REG}$).

It should be noted that in both the first circuitry 94 and the second circuitry 96 the non-overlapped gate drives are essentially "break-before-make" switches which shut off the transistors 116 and 118 before turning on the transistor 120 and 122, thereby practically removing all shoot though currents. It should also be noted that traditional inverters could alternatively be used. However, traditional inverters will create high shoot-through currents each time the component ($DATA_A$ or $DATA_B$) switches logic state.

Figures 6A, 6B, 6C, 6D:
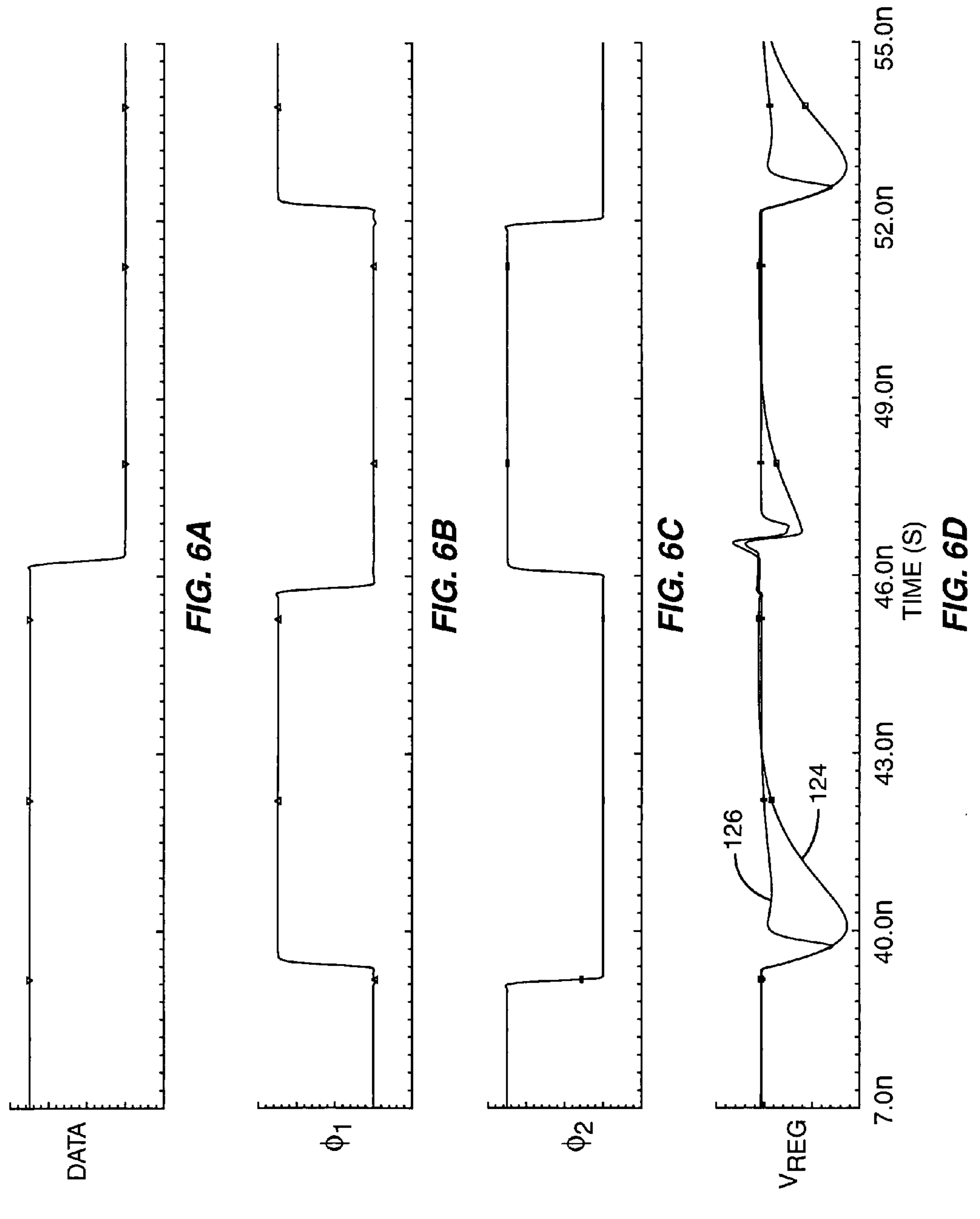
FIGS. 6A–6D illustrate the positive effect of the high-speed voltage regulator and the charge compensation scheme of the present invention.

FIGS. 6A–6D illustrate the positive effect of the high-speed voltage regulator 10 and the charge compensation scheme of the present invention. In FIG. 6D, line 124 illustrates the regulated voltage ($V_{REG}$) without the charge compensation scheme, and line 126 illustrates the regulated voltage ($V_{REG}$) with the charge compensation scheme. As shown by line 124, without the charge compensation scheme, the regulated voltage ($V_{REG}$) settles by the time the ϕ1 clock is approximately ¾ of the way through its half cycle. This may be sufficient for removing reference voltage AM. However, when considering silicon process variations, the settle time may be prolonged such that the settling time may approach the end of the half clock cycle of ϕ1, thereby decreasing the performance of the system 48 (FIG. 2). In contrast, with the charge compensation scheme, the regulated voltage ($V_{REG}$) (line 126) settles to its desired value much faster than when the charge compensation scheme is not employed. In this example, with the charge compensation scheme, the regulated voltage ($V_{REG}$) settles to its desired value in less than 1.9 ns.

Those skilled in the art will recognize improvements and modifications to the preferred embodiments of the present invention. All such improvements and modifications are considered within the scope of the concepts disclosed herein and the claims that follow.

What is claimed is:

1. A voltage regulator comprising:

a reservoir capacitance adapted to store charge corresponding to a regulated output voltage, wherein the charge stored by the reservoir capacitance is controlled by a first current;

first circuitry adapted to provide a second current based on the charge stored by the reservoir capacitance;

second circuitry adapted to receive the second current and generate a third current that is inversely related to the second current; and a current mirror adapted to provide a fourth current based on the third current and a current mirror gain ratio;

the first circuitry further adapted to provide the first current based on the fourth current such that the charge stored by the reservoir capacitance increases when the fourth current increases.

2. The voltage regulator of claim 1 wherein the first current is related to a difference between the fourth current and the second current.

3. The voltage regulator of claim 1 wherein the first current is substantially equal to a difference between the fourth current and the second current.

4. The voltage regulator of claim 1 wherein the first circuitry comprises an output transistor having an input terminal adapted to receive a bias voltage, a second terminal coupled to the reservoir capacitance and adapted to sink the second current based on the charge stored by the reservoir capacitance and the bias voltage, and a third terminal adapted to provide the second current.

5. The voltage regulator of claim 4 wherein the current mirror provides the fourth current to the second terminal of the output transistor and the first current is provided to the reservoir capacitance from the second terminal of the output transistor based on a difference between the fourth current and the second current.

6. The voltage regulator of claim 4 when a portion of the charge is drawn from the reservoir capacitance by a load, a voltage differential between the first and second terminals of the output transistor decreases and the output transistor operates to reduce the second current based on the reduced voltage differential, thereby increasing the first current and restoring the portion of the charge to the reservoir capacitance.

7. The voltage regulator of claim 1 wherein the second circuitry comprises:

a first current source adapted to sink a fifth current, wherein the fifth current is a constant current; and a second current source adapted to sink the third current from the current mirror based on the second current such that a sum of the second current and the third current is essentially equal to the constant current.

8. The voltage regulator of claim 1 wherein when a portion of the charge is drawn from the reservoir capacitance by a load, the first circuitry operates to reduce the second current.

9. The voltage regulator of claim 8 wherein when the second current decreases, the second circuitry operates to increase the third current such that the sum of the second and third currents is essentially equal to a constant current.

10. The voltage regulator of claim 9 wherein when the third current increases, the current mirror further operates to increase the fourth current to reflect the increase in the third current.

11. The voltage regulator of claim 10 wherein the fourth current is defined as the third current multiplied by the current mirror gain ratio.

12. The voltage regulator of claim 1 wherein the reservoir capacitance, first circuitry, second circuitry, and the current mirror are fabricated on a single semiconductor die.

13. The voltage regulator of claim 4 further comprising voltage bias circuitry adapted to receive a stable reference voltage and provide the DC bias to the output transistor.

14. The voltage regulator of claim 13 wherein the voltage bias circuitry comprises an amplifier adapted to amplify the stable reference voltage to provide the DC bias.

15. The voltage regulator of claim 14 wherein the voltage bias circuitry further comprises an output matching transistor in a feedback loop of the amplifier, wherein the output matching transistor compensates for a differential voltage between the first and second terminals of the output transistor.

16. A method for regulating an output voltage of a voltage regulator comprising:

storing charge in a reservoir capacitance corresponding to a regulated output voltage, wherein the charge stored is controlled by a first current;

providing a second current based on the charge stored by the reservoir capacitance;

generating a third current that is inversely related to the second current;

providing a fourth current based on the third current and a gain ratio; and providing the first current based on the fourth current such that the charge stored by the reservoir capacitance increases when the fourth current increases.

17. The method of claim 16 wherein the first current is substantially equal to a difference between the fourth current and the second current.

18. The method of claim 16 wherein the step of generating the third current comprises:

generating a fifth current, wherein the fifth current is a constant current; and generating the third current based on the second current such that a sum of the second current and the third current is essentially equal to the constant current.

19. The method of claim 16 wherein when a portion of the charge is drawn from reservoir capacitance by a load, the step of providing the second current further comprises reducing the second current to reflect the portion of the charge drawn from the reservoir capacitance.

20. The method of claim 19 wherein when the second current decreases, the step of generating the third current comprises increasing the third current such that the sum of the second and third currents is essentially equal to the constant current.

21. The method of claim 20 wherein when the third current increases, the step of providing the fourth current comprises increasing the fourth current to reflect the increase in the third current.

22. The method of claim 21 wherein the fourth current is defined as the third current multiplied by the gain ratio.

23. The method of claim 16 further comprising providing a DC bias based on a stable reference voltage, wherein the step of providing the second current is further based on the DC bias.

24. The method of claim 23 wherein the step of providing the DC bias comprises amplifying the stable reference voltage to provide the DC bias.

25. A system comprising:

a voltage regulator comprising a reservoir capacitance and adapted to control charge stored by the reservoir capacitance such that the charge corresponds to a regulated output voltage;

a reconstruction filter adapted to receive a digital signal from a data interface, sample the regulated output voltage based on the digital signal during a sampling phase of the reconstruction filter to generate a sampling signal, and provide an output signal based on the sampling signal;

first charge compensation circuitry adapted to supply charge to the reservoir capacitance during the sampling phase of the reconstruction filter; and second charge compensation circuitry adapted to supply charge to the reservoir capacitance when the digital signal transitions between a first logic state and a second logic state.

26. The system of claim 25 wherein the first charge compensation circuitry comprises:

a compensation capacitor adapted to store charge provided by a supply voltage; and circuitry adapted to couple the compensation capacitor to the reservoir capacitance during the sampling phase of the reconstruction filter, thereby providing the charge stored by the compensation capacitor to the reservoir capacitance.

27. The system of claim 26 wherein the reconstruction filter and the first compensation circuitry are further adapted to receive a first and second non-overlapping clock signal and the sampling phase of the reconstruction filter is when the first non-overlapping clock signal is asserted.

28. The system of claim 27 wherein the circuitry is further adapted to couple the compensation capacitor to the supply voltage when the first non-overlapping clock signal is not asserted such that charge is supplied from the supply voltage to the compensation capacitor.

29. The system of claim 26 wherein the compensation capacitor is sized such that the compensation capacitor provides essentially the same amount of charge to the reservoir capacitance as taken from the reservoir capacitance by the reconstruction filter during the sampling phase.

30. The system of claim 26 the second charge compensation circuitry comprises:

a second compensation capacitor adapted to store charge provided by the supply voltage;

a third compensation capacitor adapted to store charge provided by the supply voltage;

second circuitry adapted to couple the second compensation capacitor to the reservoir capacitance when the digital signal transitions from the first logic state to the second logic state, thereby providing the charge stored by the second compensation capacitor to the reservoir capacitance; and third circuitry adapted to couple the third compensation capacitor to the reservoir capacitance when the digital signal transitions from the second logic state to the first logic state, thereby providing the charge stored by the third compensation capacitor to the reservoir capacitance.

31. The system of claim 30 wherein the digital signal is a differential signal having a first differential component and a second differential component and the second circuitry operates based on the first differential component and the third circuitry operates based on the second differential component.

32. The system of claim 30 wherein the second circuitry is further adapted to couple the second compensation capacitor to the supply voltage when the digital signal transitions from the second logic state to the first logic state and the third circuitry is further adapted to couple the third compensation capacitor to the supply voltage when the digital signal transitions from the first logic state to the second logic state.

33. The system of claim 30 wherein the second compensation capacitor is sized such that the second compensation capacitor provides essentially the same amount of charge to the reservoir capacitance as taken from the reservoir capacitance by the data interface when the data signal transitions from the first logic state to the second logic state.

34. The system of claim 33 wherein the third compensation capacitor is sized such that the third compensation capacitor provides essentially the same amount of charge to the reservoir capacitance as taken from the reservoir capacitance by the data interface when the data signal transitions from the second logic state to the first logic state.

35. The system of claim 34 wherein the second and third compensation capacitors are further sized to essentially match a gate capacitance of the data interface.

36. The system of claim 32 further comprising a second voltage regulator adapted to provide the supply voltage such that the regulated output voltage is isolated from voltage drops in the supply voltage due to operation of the first and second charge compensation circuitries.

37. The system of claim 25 wherein the first charge compensation circuitry has an RC time constant that is essentially the same as an RC time constant of sampling circuitry in the reconstruction filter.

38. The system of claim 25 wherein the voltage regulator wherein the charge stored by the reservoir capacitance is controlled by a first current and the voltage regulator further comprises:

first circuitry adapted to provide a second current based on the charge stored by the reservoir capacitance;

second circuitry adapted to receive the second current and generate a third current that is inversely related to the second current; and a current mirror adapted to provide a fourth current based on the third current and a current mirror gain ratio;

the first circuitry further adapted to provide the first current based on the fourth current such that the charge stored by the reservoir capacitance increases when the fourth current increases.

39. The system of claim 38 wherein the first current is related to a difference between the fourth current and the second current.

40. The system of claim 38 wherein the first current is substantially equal to a difference between the fourth current and the second current.

41. The system of claim 38 wherein the first circuitry comprises an output transistor having an input terminal adapted to receive a bias voltage, a second terminal coupled to the reservoir capacitance and adapted to sink the second current based on the charge stored by the reservoir capacitance and the bias voltage, and a third terminal adapted to provide the second current.

42. The system of claim 41 wherein the current mirror provides the fourth current to the second terminal of the output transistor and the first current is provided to the reservoir capacitance from the second terminal of the output transistor based on a difference between the fourth current and the second current.

43. The system of claim 41 when a portion of the charge is drawn from the reservoir capacitance by a load, a voltage differential between the first and second terminals of the output transistor decreases and the output transistor operates to reduce the second current based on the reduced voltage differential, thereby increasing the first current and restoring the portion of the charge to the reservoir capacitance.

44. The system of claim 38 wherein the second circuitry comprises:

a first current source adapted to sink a fifth current, wherein the fifth current is a constant current; and a second current source adapted to sink the third current from the current mirror based on the second current such that a sum of the second current and the third current is essentially equal to the constant current.

45. The system of claim 38 wherein when a portion of the charge is drawn from the reservoir capacitance by a load, the first circuitry operates to reduce the second current.

46. The system of claim 45 wherein when the second current decreases, the second circuitry operates to increase the third current such that the sum of the second and third currents is essentially equal to a constant current.

47. The system of claim 46 wherein when the third current increases, the current mirror further operates to increase the fourth current to reflect the increase in the third current.

48. The system of claim 47 wherein the fourth current is defined as the third current multiplied by the current mirror gain ratio.

49. The system of claim 38 wherein the reservoir capacitance, first circuitry, second circuitry, and the current mirror are fabricated on a single semiconductor die.

50. The system of claim 41 further comprising voltage bias circuitry adapted to receive a stable reference voltage and provide the DC bias to the output transistor.

51. The system of claim 50 wherein the voltage bias circuitry comprises an amplifier adapted to amplify the stable reference voltage to provide the DC bias.

52. The system of claim 51 wherein the voltage bias circuitry further comprises an output matching transistor in a feedback loop of the amplifier, wherein the output matching transistor compensates for a differential voltage between the first and second terminals of the output transistor.

* * * * *